United States Patent [19]
Kuriyama et al.

[11] Patent Number: 5,915,299
[45] Date of Patent: *Jun. 29, 1999

[54] STAMP MAKING UNIT AND PACKAGE THEREFOR

[75] Inventors: Hiroshi Kuriyama; Youichi Kodaira; Kozo Gyoda, all of Suwa, Japan

[73] Assignee: Seiko Epson Corporation, Tokyo, Japan

[*] Notice: This patent is subject to a terminal disclaimer.

[21] Appl. No.: 08/623,403

[22] Filed: Mar. 28, 1996

[30] Foreign Application Priority Data

Mar. 30, 1995 [JP] Japan ................................. 7-099775
Feb. 22, 1996 [JP] Japan ................................. 8-035242

[51] Int. Cl.$^6$ ............................................. B41C 1/14
[52] U.S. Cl. ................................. 101/128.21; 101/128.4; 430/300; 430/306
[58] Field of Search .................... 101/128.4, 128.21, 101/395, 401.1; 430/300, 306

[56] References Cited

U.S. PATENT DOCUMENTS 5,669,304   9/1997   Kuriyama et al. ..................... 101/401.1

Primary Examiner—John Hilten
Attorney, Agent, or Firm—Loeb & Loeb LLP

[57] ABSTRACT

A stamp making unit is provided having a structure such that gel photosensitive resin for forming a stamping surface can be protected appropriately and non-cured portions of the photosensitive resin can easily be removed after the stamping surface has been formed. A package capable of satisfactorily storing a stamp making unit of the foregoing type is also provided. The stamp making unit uses photosensitive resin as a base material for forming a stamping surface of a stamp which changes from a gel state to a solid state due to received light. The stamping unit comprises a stock member, photosensitive resin bonded to a surface of the stock member on which the stamping surface is formed and a cover member bonded to a surface of the photosensitive resin having light transmission properties. Adhesion between the photosensitive resin in the gel state and the stock member is weaker than adhesion between the photosensitive resin in the gel state and the cover member. Also, adhesion between the photosensitive resin in the solid state and the stock member is stronger than adhesion between the photosensitive resin in the solid state and the cover member.

8 Claims, 5 Drawing Sheets

STAMP MAKING UNIT AND PACKAGE THEREFOR

BACKGROUND OF THE INVENTION

1. Technical Field

The present invention relates to a stamp making unit capable of easily making a stamp for a seal impression, a rubber stamp or the like for forming a required impression, and to a package for the stamp making unit.

2. Discussion

Previously, so-called stamp making apparatus or a seal-impression forming stamp making apparatus have been available on the market for forming a stamp for a seal impression or a rubber stamp (generally referred to as "stamps"). A stamp making unit for use in the foregoing apparatus consists of a stamping-surface forming member and a stock member for supporting the stamping-surface forming member. Each of the foregoing members is prepared as a separate individual member. The stamping-surface forming member consists of a base member and an ultraviolet-curing resin secured to the base member, the ultraviolet-curing resin forming the stamping surface. Although the ultraviolet-curing resin has inherent hardness and brittleness in a stationary state, the ultraviolet-curing resin is hardened and has tenacity when irradiated with ultraviolet rays. The ultraviolet-curing resin, which is soluble with respect to water in a stationary state, becomes insoluble when irradiated with ultraviolet rays.

A stamp is made by using the foregoing stamp making apparatus by taking a negative film having an image to be stamped thereon by the exposing portion of the apparatus. The negative film is then used as a mask while the ultraviolet-curing resin of the stamp is exposed to ultraviolet rays. As a result of this exposing operation, the portion of the ultraviolet-curing resin corresponding to the image to be stamped is hardened. A brush or the like is then used to sweep the portion of the ultraviolet-curing resin which has not been hardened while the ultraviolet-curing resin is immersed in water. Generally, the ultraviolet-curing resin is again irradiated with ultraviolet rays to stabilize the stamping surface. Then, the stamping-surface forming member is attached to the stamp base thereby forming the stamp.

However, the conventional method of forming the stamp involves a complicated operation taking a long time to completely sweep the non-cured portions of the ultraviolet-curing resin due to the non-cured portions having the inherent hardness and brittleness. Furthermore, an unskilled operator using the brush sometimes excessively rubs the surface of the cured portions, thus causing the cured portions to be damaged. Moreover, the rough-surface areas (portions for keeping ink on the stamping surface and prevent it from shedding) of the hardened portions, to which ink adheres, can be undesirably erased into flat shapes.

By employing ultraviolet-curing resin of a gel type when not cured, the foregoing problems can be overcome. However, the gel type ultraviolet-curing resin must be appropriately protected before it is hardened. Moreover, it is preferable that a method for removing the non-cured portions of the ultraviolet-curing resin be employed that suits the characteristics of the gel.

The photosensitive resin of the foregoing type deteriorates if it is not in contact with oxygen (respiration) or if it is allowed to stand at high temperatures. That is, if the foregoing photosensitive resin is stored in a sealed state, it can be undesirably cured or its sensitivity with respect to light deteriorated.

SUMMARY OF THE INVENTION

An object of the present invention is to provide a stamp making unit capable of appropriately protecting gel-type photosensitive resin thereof for forming a stamping surface and easily removing non-cured portions of the photosensitive resin after the stamping surface has been formed. It is a further object of the present invention to provide a package capable of satisfactorily storing a stamp making unit of the foregoing type.

According to the present invention, there is provided a stamp making unit using photosensitive resin which serves as a base material for forming a stamping surface of a stamp which is changed from a gel state to a solid state due to received light. The stamp making unit comprises a stock member, the photosensitive resin bonded to a surface of the stock member on which the stamping surface is formed and a cover member bonded to a surface of the photosensitive resin having light transmission properties. Adhesion between the photosensitive resin in the gel state and the stock member is weaker than adhesion between the photosensitive resin in the gel state and the cover member. Also, adhesion between the photosensitive resin in the solid state and the stock member is stronger than adhesion between the photosensitive resin in the solid state and the cover member.

Since the photosensitive resin which changes from a gel state to a solid state due to received light is used, exposure of the photosensitive resin corresponding to the pattern to be stamped through the cover member results in only the portions exposed to light being solidified (coagulated). The other gel portions remain unchanged. The adhesion between the photosensitive resin in a gel state and the stock member is weaker than that between the photosensitive resin and the cover member. Also, the adhesion between the photosensitive resin in a solid state and the stock member is stronger than that between the photosensitive resin and the cover member. Therefore, the portions of the photosensitive resin, which have been exposed to light, are bonded strongly to the stock member and the portions, which have not been exposed to light, are bonded strongly to the cover member after the exposure has been performed (after the stamping surface has been formed). As a result, when the cover member is separated after the stamping surface has been formed, the portions of the photosensitive resin which have not been exposed to light are separated from the stock member together with the cover member. The portions of the photosensitive resin which have been exposed to light are left on the surface of the stock member. Thus, the unnecessary non-exposed portions of the photosensitive resin can be removed together with the cover member so that a letterpress stamping surface or an intaglio stamping surface is obtained from the portions in which the photosensitive resin has been solidified. Note that "gel" means an intermediate state between a liquid and a solid, the intermediate state being a self-holding enabled state. Also, the term "bonding" is intended to include "tacking" with respect to the intensity of the adhesion.

It is preferable that the stamp making unit have a structure such that the cover member has a bonding-adhesive layer for bonding the cover member to the surface of the photosensitive resin, and that the adhesion of the bonding-adhesive layer be weakened due to received light. Thus, the adhesion of the exposed portions of the bonding-adhesive layer of the cover member can be desirably weakened when the photosensitive resin is exposed to light. As a result, unnecessary non-exposed portions of the photosensitive resin can be reliably removed together with the cover member.

It is also preferable that the stamp making unit have a structure such that the stock member further includes a base member through which the photosensitive resin is bonded to the stock member. By this structure, the photosensitive resin and the stock member are bonded to each other through the base member. If base member material suitable to the photosensitive resin is selected, a problem of undesirable separation of the photosensitive resin from the stock member can be prevented after the stamping surface has been formed. Moreover, the material of the stock member is not limited.

It is further preferable that the stamp making unit have a structure such that the base member has a bonding-adhesive layer on the surface thereof facing the photosensitive resin so as to bond the photosensitive resin, whereby the adhesion of the bonding-adhesive layer is strengthened due to received light. This structure provides the adhesion of the exposed portions of the bonding-adhesive layer of the base member to be strengthened upon exposing the photosensitive resin to light. Therefore, unnecessary non-exposed portions of the photosensitive resin can be reliably removed together with the cover member.

It is also preferable that the stamp making unit have a structure such that the photosensitive resin is ultraviolet-curing type resin. Thus, the material can be easily obtained and the cost can be reduced.

It is further preferable that the stamp making unit have a structure such that the photosensitive resin is ultraviolet-curing silicon resin. The foregoing structure results in excellent rubber elasticity after the photosensitive resin has been cured as compared with acrylic type ultraviolet-curing resin. Moreover, the foregoing photosensitive resin does not harm the human body and forms a satisfactory stamping surface.

A package for storing a stamp making unit having a photosensitive resin serving as a base for forming a stamping surface, includes a light shielding characteristic, gas permeability and waterproofness. The light shielding characteristic prevents the photosensitive resin accommodated in the package from being exposed to light. If water-soluble photosensitive resin is used, the water-soluble photosensitive resin, which has not been exposed to light, will be prevented from accidental dissolving through waterproofness. Moreover, the gas permeability prevents undesirable temperature increases in the package and keeps the photosensitive resin in contact with fresh air, that is, oxygen. Therefore, deterioration of the photosensitive resin, such as curing or degradation of the photosensitivity, can be prevented. Note that the package may be formed, among others, into a bag type or a container type configuration.

According to the present invention, there is provided a package for storing a stamp making unit using a photosensitive resin as a base for forming a stamping surface. The package comprises a body having waterproofness and light shielding characteristics and is arranged to store the stamp making unit. A ventilation portion is formed in a portion of the body of the package providing gas permeability and waterproofness.

As a result of the foregoing structure, the package has a light shielding characteristic, gas permeability and waterproofness so that deterioration of the photosensitive resin is effectively prevented and the stamp making unit is appropriately stored. If the ventilation portion is provided partially, the cost can be reduced.

It is preferable that the package for storing the stamp making unit have a structure such that the ventilation portion has a hole formed in the body of the package and a closing member for closing the hole. The closing member preferably has a porous film made of tetrafluoroethylene. Thus, the closing member enables one element to have both gas permeability and waterproofness, which have previously been considered to be antithetical concepts. Moreover, the structure can be simplified and the package can be manufactured with a relatively low cost.

Other objects, features and advantages of the invention will be evident from the following detailed description of the preferred embodiments described in conjunction with the attached drawings.

BRIEF DESCRIPTION OF THE DRAWINGS

FIG. 5 is an enlarged cross sectional view showing part of the resin holding portion of the stamp making unit shown in FIG. 4, in which

DETAILED DESCRIPTION OF THE PREFERRED EMBODIMENTS

Figure 1:
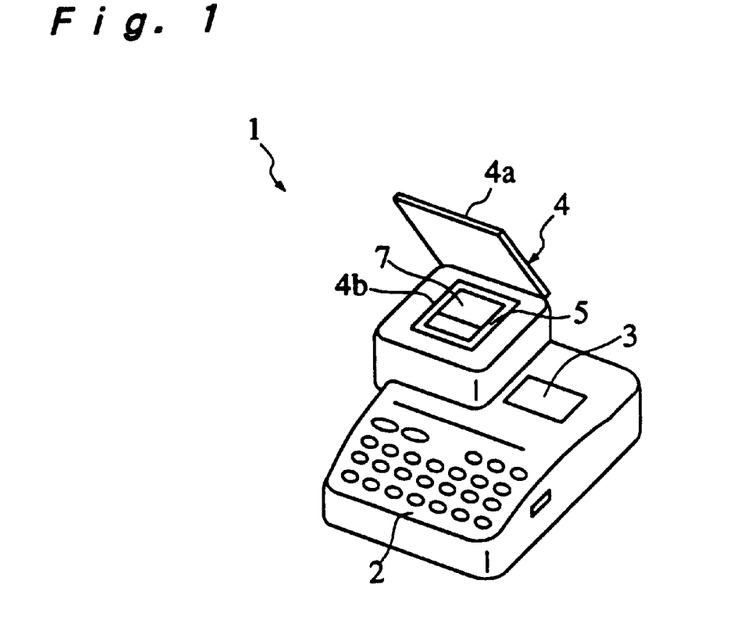
FIG. 1 is a perspective view of a stamp making apparatus for forming a stamp by using a stamp making unit according to the present invention.
Figure 2:
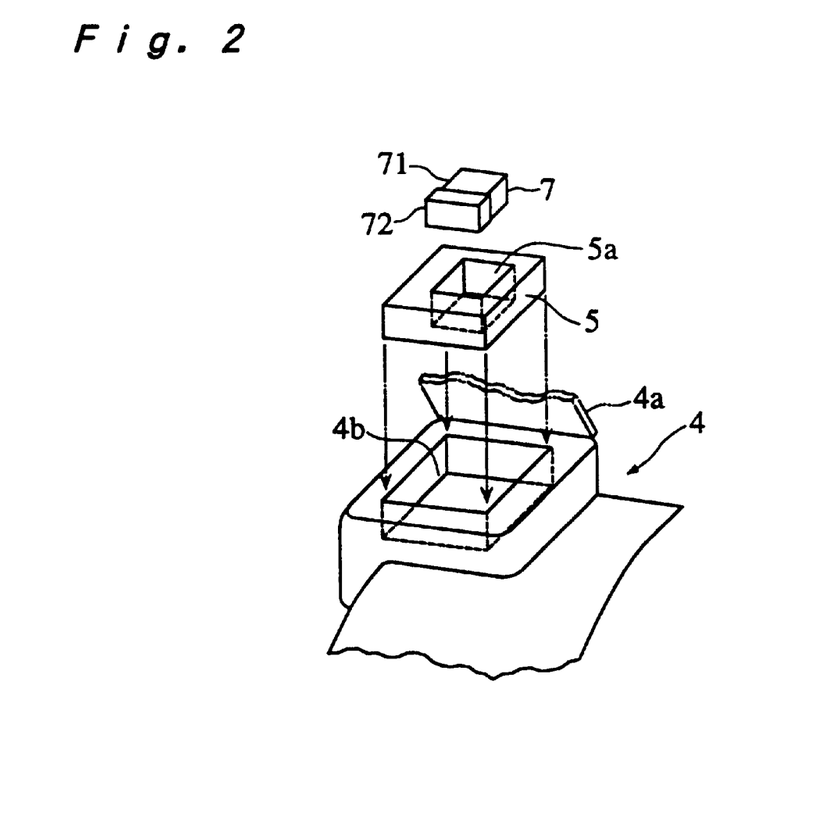
FIG. 2 is a partially-exploded perspective view showing how a cartridge and a stamp making unit are mounted on the ribbon cartridge holder shown in FIG. 1.

With reference to the drawings, preferred embodiments of the present invention will now be described. FIGS. 1 and 2 show the schematic structure of a stamp making apparatus to which the present invention can be applied. The stamp making apparatus is able to form a letterpress stamp. As shown in FIGS. 1 and 2, a stamp making apparatus 1 has a key input portion 2 for inputting desired characters, a display portion 3 for displaying inputted characters and the like, and a ribbon cartridge holder 4. The ribbon cartridge holder 4 has a cover 4a to cause a rectangular receiving recess 4b formed in the ribbon cartridge holder 4 to be visible when the cover 4a is opened. Thus, a rectangular ribbon cartridge 5 can be loaded in the receiving recess 4b.

As shown in FIG. 2, a rectangular pocket 5a is formed in the central portion of the ribbon cartridge 5. The pocket 5a is able to receive a stamp making unit 7 according to the present invention. The ribbon cartridge 5, at a position apart from the pocket 5a, includes an ink ribbon and a printing-paper ribbon (to be described below).

Figure 3:
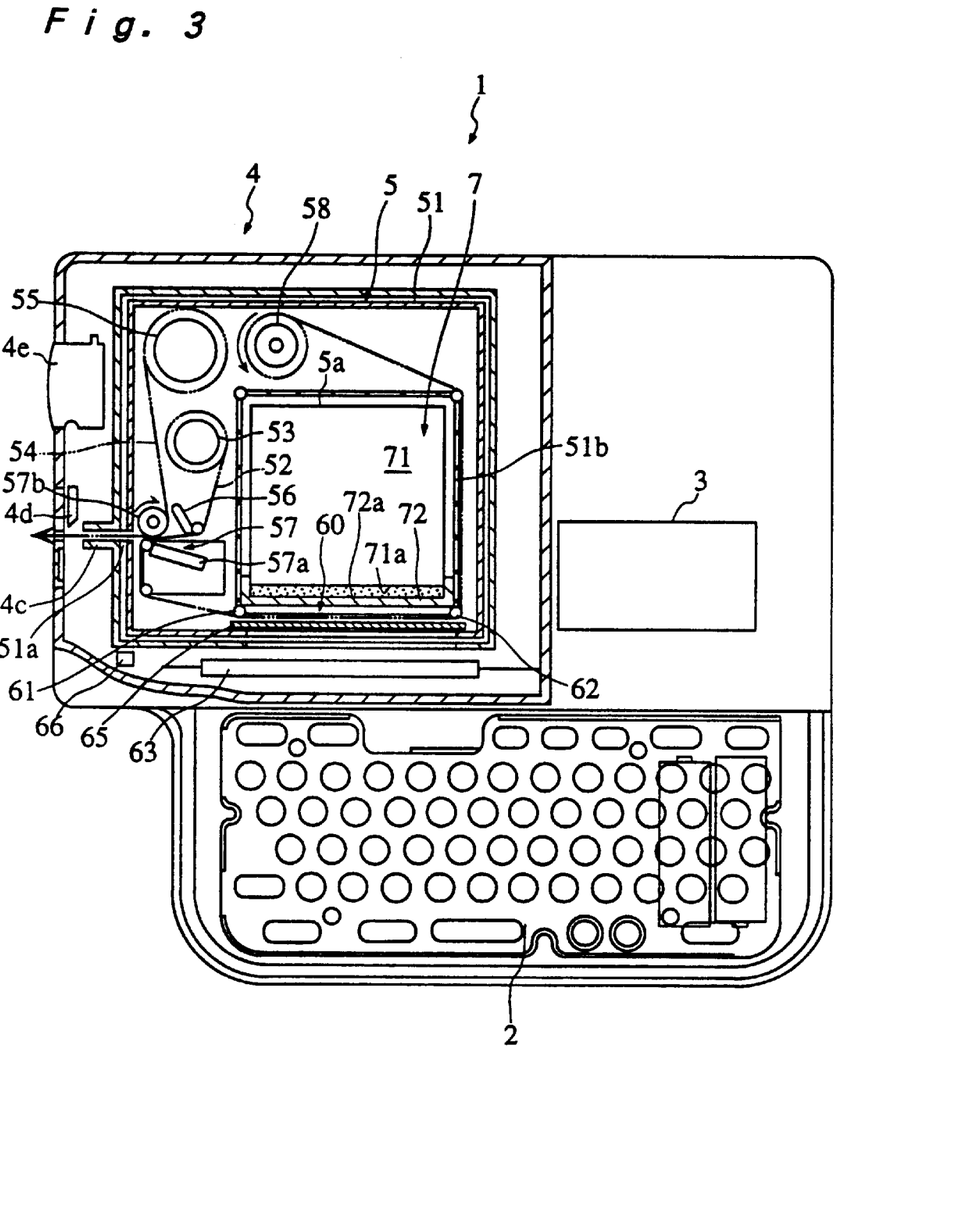
FIG. 3 is an enlarged plan view showing the structure of the ribbon cartridge holder shown in FIG. 1 and the ribbon cartridge.

As shown in FIG. 3, the structure of the ribbon cartridge holder 4 and the ribbon cartridge 5 will now be described. The ribbon cartridge 5 has a cartridge case 51 having a predetermined thickness and including a delivery reel 53 for delivering an ink ribbon 52, a winding reel 58 for winding the ink ribbon 52, and a printing-paper reel 55 for delivering a printing-paper ribbon 54. The ink ribbon 52 is delivered from the delivery reel 53 and then guided by a guide 56 and moved to a printing position 57. The ink ribbon 52 is moved from an exposing position 60 along an inner wall 51b so as to be wound around the winding reel 58. A drive shaft (not shown) of the winding reel 58 is located to face a receiving recess 4b of the ribbon cartridge holder 4. When the ribbon cartridge 5 is placed within the receiving recess 4b, the winding reel 58 is engaged to the drive shaft.

The printing-paper ribbon 54 is delivered from the printing-paper reel 55, and is guided to the printing position 57 and is superposed on the ink ribbon 52. The printing-paper ribbon 54 is then passed through a discharge opening 51a formed in the side surface of the cartridge case 51 and then discharged to the outside of the apparatus. Also a discharge opening 4c is formed in the body of the apparatus at a position on an extended line from the discharge opening 51a to discharge the printing-paper ribbon 54 to the outside of the apparatus through the discharge opening 4c. A cutter 4d is disposed adjacent to the discharge opening 4c. When a cutter button 4e, disposed adjacent to the cutter 4d, is depressed the printing-paper ribbon 54 discharged to the outside of the apparatus is cut to a predetermined length.

A thermal-transfer printing head 57a and a platen roller 57b facing the printing head 57a are disposed at the printing position 57. The printing head 57a is disposed adjacent to the receiving recess 4b of the ribbon cartridge holder 4 to penetrate the cartridge case 51 of the ribbon cartridge 5 and then face the inside portion of the rectangular cartridge case 51. The platen roller 57b has a roller attached adjacent to the ribbon cartridge 5 and a drive shaft attached adjacent to the receiving recess 4b. As a result, when the ribbon cartridge 5 is loaded in the receiving recess 4b, the printing head 57a and the platen roller 57b face each other and are located apart from each other a short distance. Moreover, the platen roller 57b is engaged to the drive shaft thereof so that rotation is permitted.

The exposing position 60 is determined to be a portion along one side of the inner wall 51b of the cartridge case 51. A pair of guides 61 and 62 are disposed at two ends of the inner wall 51b. The body of the apparatus is shown to include an ultraviolet-ray irradiation source 63 serving as an exposing means according to the present invention. The ultraviolet-ray irradiation source 63 is positioned parallel to the ink ribbon 52 between the guides 61 and 62. Located between and parallel to the ink ribbon 52 and the ultraviolet-ray irradiation source 63, is a ribbon retaining plate 65 through which ultraviolet rays are transmittable. The ribbon retaining plate 65 is disposed adjacent to the receiving recess 4b of the stamp making apparatus 1.

As shown in FIG. 3, when the ribbon cartridge 5 is mounted, the ribbon retaining plate 65 is located more adjacent to the ultraviolet-ray irradiation source 63 than to the pair of the guides 61 and 62. The ribbon retaining plate 65 is able to move towards the ink ribbon 52 and the guides 61 and 62 by a mechanism (not shown). When exposure to ultraviolet rays is performed, the ribbon retaining plate 65 presses the ink ribbon 52 arranged between the guides 61 and 62 against the stamp making unit 7. In the foregoing case, the pair of guides 61 and 62 are, by a spring or the like (not shown), enabled to move toward the stamp making unit 7 in such a manner that the pair of the guides 61 and 62 are moved to follow the movement of the ribbon retaining plate 65.

When the exposing operation is performed, a negative portion of the ink ribbon 52 is pressed against a transparent cover 72 of the stamp making unit 7 by the ribbon retaining plate 65. Therefore, the problem of irradiation light being leaked to undesirable portions is prevented. Note that the ribbon retaining plate 65 may be formed into a rectangular frame including a rectangular opening in the central portion thereof to correspond to the negative portion of the ink ribbon 52.

As shown in FIG. 3, the ribbon cartridge holder 4 has a cover opening detection switch 66 for detecting opening/closing of the cover 4a of the ribbon cartridge holder 4. The cover opening detection switch 66 is operated in synchronization with opening/closing of the cover 4a. When the cover 4a is opened, the ultraviolet-ray irradiation source 63 is automatically turned off. As a result, even if the receiving recess 4b is unintentionally opened during the exposure operation using the ultraviolet rays, the ultraviolet-ray irradiation source 63 is automatically turned off. Thus, leakage of the ultraviolet rays is prevented.

Figure 4:
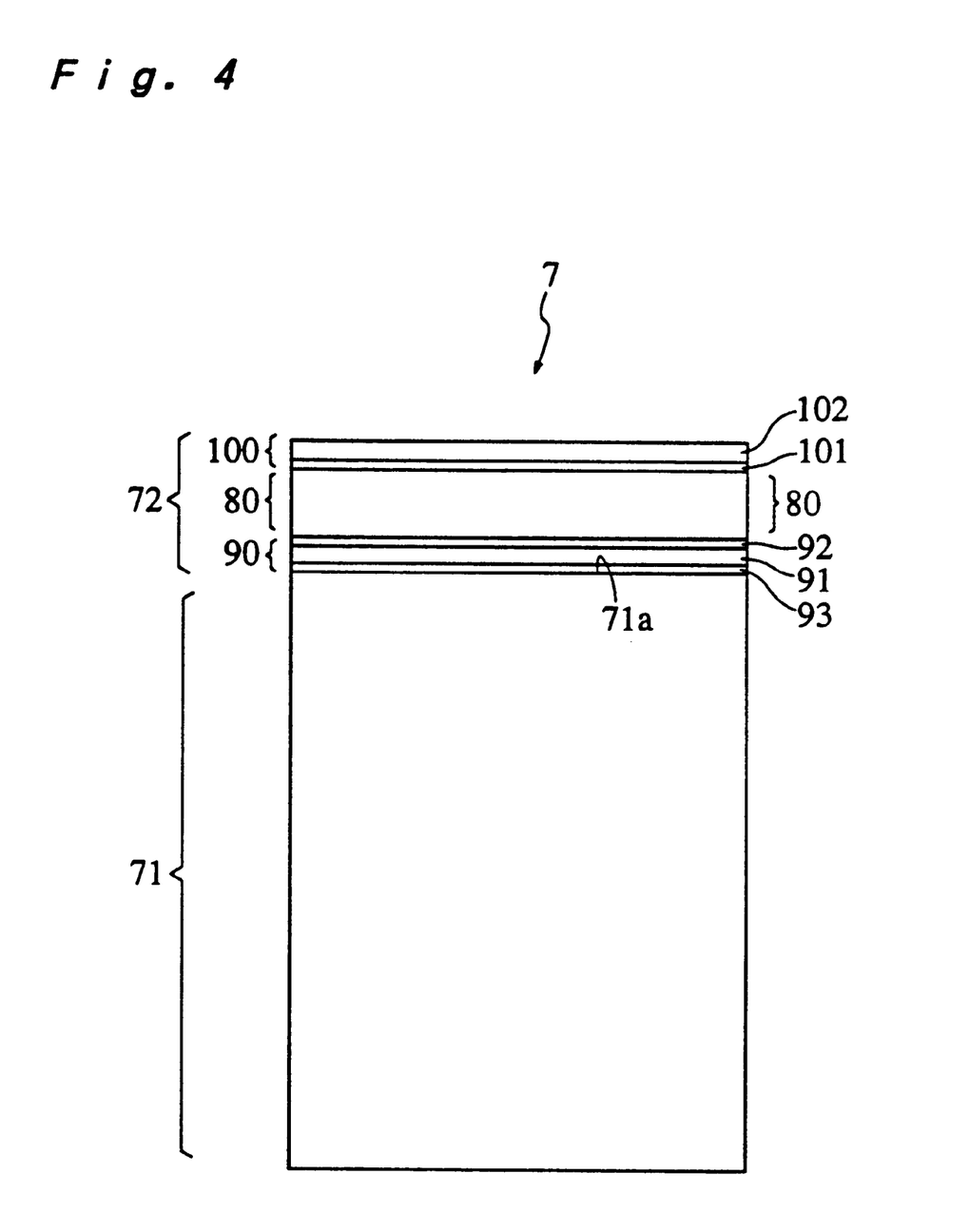
FIG. 4 is a diagrammatic view showing the structure of the stamp making unit according to the present invention.

Referring to FIGS. 3 and 4, the stamp making unit 7 will now be described. The stamp making unit 7 is formed into a rectangular parallelepiped and includes a stock member 71 and a resin holding portion 72 attached to an end surface 71a of the stock member 71. The resin holding portion 72 has a structure capable of holding ultraviolet-curing type photosensitive resin which is changed from a gel state (an intermediate state between a liquid phase and solid phase in which self-holding is enabled) to a solid phase when irradiated with rays having a specific wavelength, e.g., ultraviolet rays. As will be described in greater detail below, the ultraviolet-curing type photosensitive resin is enabled to be exposed to light transmitted from the outside of the stamp making unit 7.

Specifically, the resin holding portion 72 is formed into a triple-layer structure consisting of a resin layer (photosensitive resin) 80 preferably composed of gel type silicon resin, which is an ultraviolet-curing type resin, a base member 90 bonded to the surface of the stock member 71, and a cover member 100 bonded to another surface of the resin layer 80. As a matter of course, a double-layer structure can be formed from which the base member 90 is omitted if the end surface 71a of the stock member 71 is processed and machined to have satisfactory adhesion with respect to the resin layer 80. In the foregoing case, the function of the base member 90 for supporting the resin layer 80 is performed by the end surface 71a of the stock member 71.

The ultraviolet-curing type silicon resin forming the resin layer 80 can easily be prepared into a rubber type material and exhibits excellent elasticity and satisfactory durability after it has been cured as compared with acrylic-type ultraviolet-curing resin. Therefore, the foregoing silicon resin can be used to form a satisfactory letterpress stamping surface.

The base member 90 is formed into a triple-layer structure consisting of, for example, a polyester film 91, a first bonding-adhesive layer 92 adjacent to the resin layer 80, and a second bonding-adhesive layer 93 adjacent to the stock member 71. The polyester film 91 is bonded to the resin layer 80 through the first bonding-adhesive layer 92. Moreover, the first bonding-adhesive layer 92 is bonded to the stock member 71 through the second bonding-adhesive layer 93. Specifically, the first bonding-adhesive layer 92 is formed into the polyester film 91. The polyester film 91 having the first bonding-adhesive layer 92 therein is bonded to the stock member 71 through the second bonding-adhesive layer 93. The first bonding-adhesive layer 92 strengthens the adhesion between the polyester film 91 and the resin layer 80. Thus, the first bonding-adhesive layer 92 significantly strengthens the adhesion between the cover member 100 and the resin layer 80 in addition to the strong adhesion obtainable from curing of the resin layer 80.

The cover member 100 is a so-called adhesive tape comprising of a bonding-adhesive layer 101 made of acrylic resin or the like, and a film layer 102 for supporting the bonding-adhesive layer 101. The cover member 100 is ultraviolet-ray transmissible and also features an adhesion (tacking strength) of portions of the bonding-adhesive layer 101 which considerably weakens as compared with the initial adhesion when the cover member 100 is irradiated with ultraviolet rays. An adhesive tape of the foregoing type is generally called a "UV sheet" and a tape for use in a process for dicing semiconductor wafers may be available. The adhesion between the resin layer 80 and the polyester film 91 obtainable due to the first bonding-adhesive layer 92 and that between the resin layer 80 and the cover member 100 obtainable due to the bonding-adhesive layer 101 are configured in such a manner that the former adhesion is stronger than the latter adhesion before the exposing process is performed.

A process for forming the stamp by the stamp making apparatus 1 according to this embodiment will now be described with reference to FIGS. 1 and 3. A user who intends to form the stamp initially opens the cover 4a of the ribbon cartridge holder 4 and mounts the ribbon cartridge 5 within the receiving recess 4b. The user then mounts the stamp making unit 7 within the pocket 5a of the mounted ribbon cartridge 5 and closes the cover 4a.

Next, the user inputs desired characters (or desired images) to be stamped by using the key input portion 2. Since the inputted character group is displayed on the display portion 3, the user can confirm whether or not the desired characters have been inputted. After the user has inputted the desired character group, a printing operation is initiated by using the key input portion 2. As a result, a ribbon conveyance mechanism and a printing control mechanism included in the body of the apparatus are operated so that feeding of the ink ribbon 52 is started and a heating element of the printing head 57a is operated so that a printing operation is performed with respect to the ink ribbon 52 and the printing-paper ribbon 54 which pass through the printing position 57.

As a result, the characters to be stamped are printed on the printing-paper ribbon 54 which passes through the printing position 57. Thus, ink in the portions of the ink ribbon 52 corresponding to the characters to be stamped are transferred to the printing-paper ribbon 54. In other words, the characters to be stamped are printed on the printing-paper ribbon 54 and a negative film is formed on the ink ribbon 52 corresponding to the characters to be stamped. The printing-paper ribbon 54 is then discharged to the outside of the apparatus through the discharge opening 51a and the discharge opening 4c, and cut to have a predetermined length by the cutter 4d. The ink ribbon 52 is moved forward and stopped at a position at which the negative film portion reaches the exposing position 60.

When the negative film portion of the ink ribbon 52 has reached the exposing position 60, the ribbon retaining plate 65 is moved toward the ink ribbon 52. Thus, the ribbon retaining plate 65 brings the negative film portion of the ink ribbon 52 which is between the two guides 61 and 62 into close contact with the surface of the cover member 100 of the stamp making unit 7. The ultraviolet-ray irradiation source 63 is then actuated so that the resin layer 80 of the resin holding portion 72 of the stamp making unit 7 is exposed to light through the cover member 100 for a predetermined time while using the negative film portion of the ink ribbon 52 as a mask. As a result, the portions of the resin layer 80 exposed to light are cured and, therefore, changed from a gel state to a solid state. Moreover, the non-exposed portions remain in a gel state. Thus, the cured portions corresponding to the characters of the resin layer 80 to be stamped form the stamping surface. After the exposing process has been completed, the ribbon retaining plate 65 is moved to the initial position and the pair of guides 61 and 62 are returned to their initial positions. The user then opens the cover 4a to obtain the stamp making unit 7 and separates the cover member 100 from the stamp making unit 7.

Figure 5A:
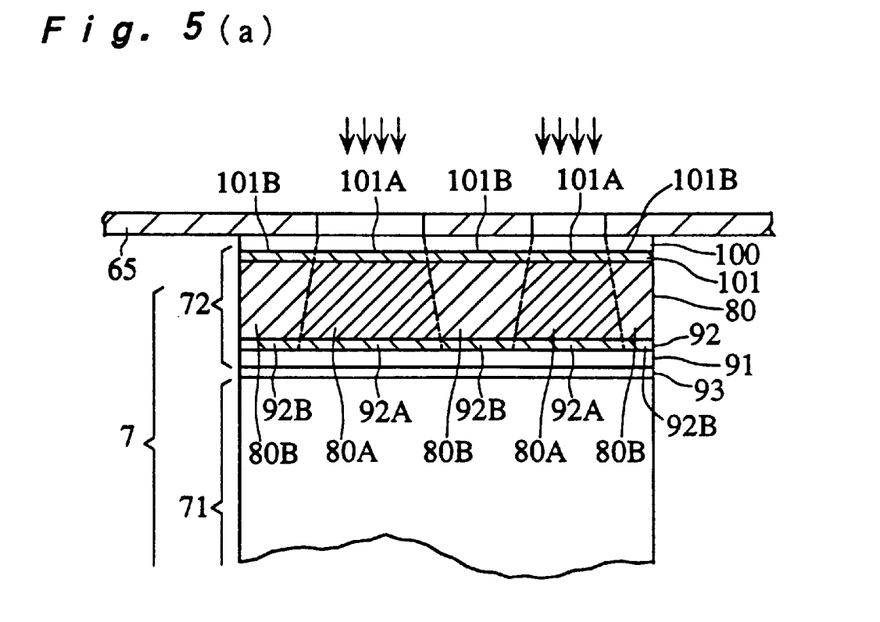
FIG. 5(a) is an enlarged cross sectional view showing photosensitive resin being exposed to light and thus cured and FIG. 5(b) is an enlarged cross sectional view showing a cover member being removed.

As described above, the cover member 100 (that is, the bonding-adhesive layer 101) has the characteristic with which the adhesion of the portions irradiated with ultraviolet rays is considerably weakened. Therefore, when the bonding-adhesive layer 101 has been exposed to ultraviolet rays, the adhesion (tacking strength) of exposed portions 101A of the bonding-adhesive layer 101 corresponding to cured portions 80A of the resin layer 80 is considerably weakened, as shown in FIG. 5(a). On the other hand, non-exposed portions 101B maintain the initial adhesion (tacking strength). That is, the adhesion between the cured portions 80A of the resin layer 80 and the cover member 100 is weak. On the other hand, the initial great adhesion between the non-cured portions 80B of the resin layer 80 and the cover member 100 is maintained.

Furthermore, the adhesion between the resin layer 80 and the base member 90 is weaker than that between the resin layer 80 and the cover member 100 where the resin layer 80 has not been exposed to ultraviolet rays. After exposure to ultraviolet rays, the adhesion of non-exposed portions 92A of the first bonding-adhesive layer 92 is strengthened due to the effect obtained from curing of the resin layer 80. On the other hand, non-exposed portions 92B maintain the initial adhesion. As a result, the adhesion between the cured portions 80A of the resin layer 80 and the base member 90 with which the cured portions 80A are in contact is strengthened. Also, the initial adhesion between the non-cured portions 80B of the resin layer 80 and the base member 90, with which the non-cured portions 80B are in contact, is maintained.

As a result, the adhesion of the cured portions 80A of the resin layer 80 with respect to the base member 90 is strengthened as compared with that of the resin layer 80 before the exposure operation. Thus, the adhesion with respect to the cover member 100 is weakened so that the adhesion with respect to the base member 90 is considerably strengthened. On the other hand, the adhesion of the non-cured portions 80B of the resin layer 80 before the exposure operation is maintained. That is, the adhesion of the non-cured portions 80B of the resin layer 80 with respect to the cover member 100 is stronger than that with respect to the base member 90.

Figure 5B:
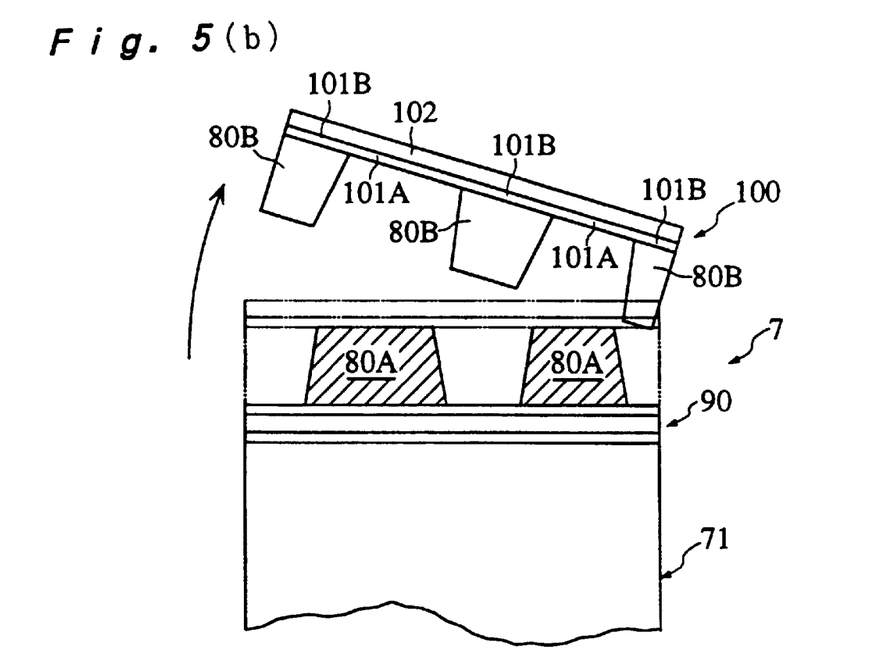

Therefore, the cover member 100 can easily be separated from the cured portions 80A of the resin layer 80. Thus, the cured portions 80A are left on the stock member 71. On the other hand, the non-cured portions 80B in the gel state are bonded to the cover member 100, and the non-cured portions 80B are separated with the cover member 100 from the cured portions 80A and the stock member 71.

As a result, a stamp having a letterpress stamping surface capable of stamping desired characters can be obtained from the stamp making unit 7. To indicate the stamping impression of the stamp making unit 7, the cut printing-paper ribbon 54 is bonded to the rear surface of the stock member 71, having characters printed in the foregoing printing process.

As described above, the stamp making unit 7 has an arrangement such that the ultraviolet-curing gel type resin layer is exposed to light and cured. Therefore, the cured portions are simply separated from the non-cured portions and the sweeping operation using fluid or the like is not required as in a case where a solid-state ultraviolet-curing resin is employed. Since the material of the cover member 100 serving as the adhesive tape according to this embodiment has the characteristic with which the adhesion of the portions irradiated with ultraviolet rays is weakened as compared with the initial adhesion, the operation for separating the non-cured portions 80B of the resin layer 80 from the cured portions 80A of the resin layer 80 can be easily completed in a short time. Since a liquid reservoir for reserving liquid resin is not required as in a case where the liquid resin is employed, the number of elements can be decreased.

Since the silicon resin is used as the ultraviolet-curing resin, advantages can be obtained in that excellent hot and low temperature resistance can be realized and the foregoing resin is safe with respect to the human body as compared with the acrylic type ultraviolet-curing resin. Moreover, the cured silicon resin has excellent characteristics as a rubber elastic member. Another advantage can be obtained in that a cushion is not required between the formed letterpress stamping surface and the stock member 71.

Note that the photosensitive resin may, of course, be gel type photosensitive resin other than the ultraviolet-curing silicon resin described above.

Figure 6:
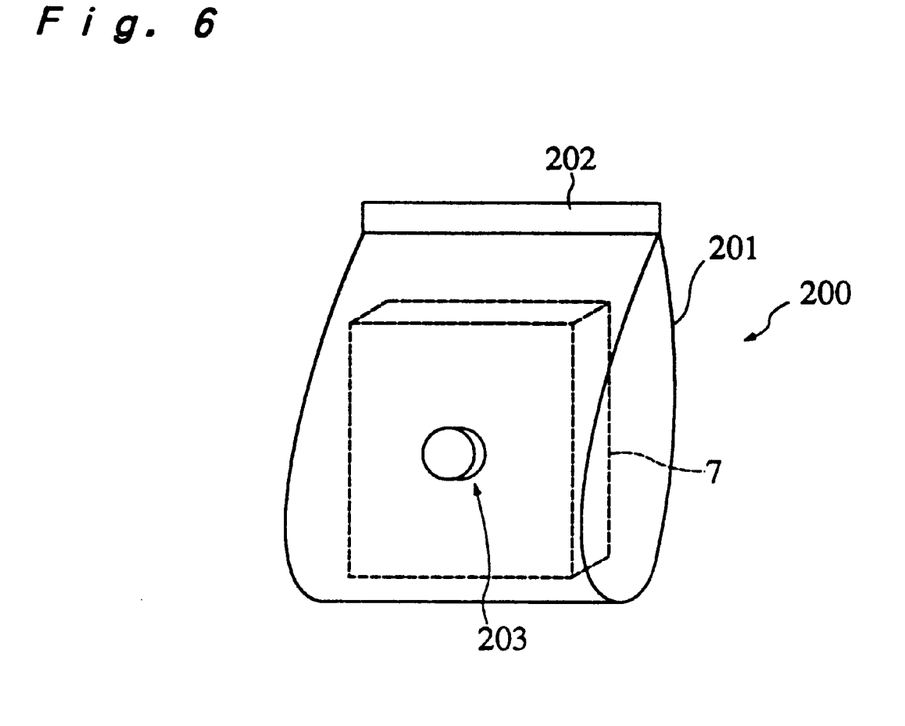
FIG. 6 is a perspective view showing a package for storing the stamp making unit according to the present invention.

FIG. 6 shows an example of a storing package for storing the stamp making unit 7 having the foregoing structure. A storing package 200 is in the form of a bag (a body of the package) 201 made of material which does not permit fluid to pass through (i.e., waterproofness). The bag 201 has an opening 202 through which the stamp making unit 7 is introduced and taken out. The stamp making unit 7 is introduced into the bag 201 through the opening 202 and then the opening 202 is closed. The bag 201 has a ventilation portion 203, on the side surface thereof.

Figure 7:
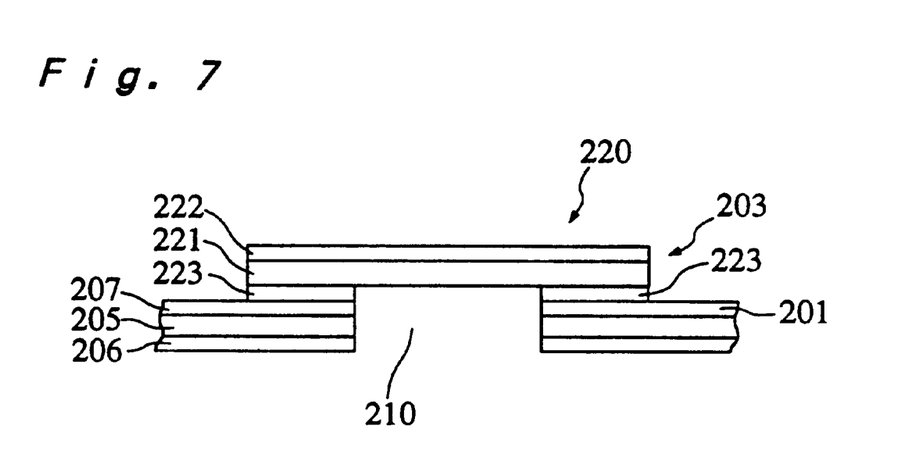
FIG. 7 is an enlarged cross sectional view of a ventilation portion of the package shown in FIG. 6.

As shown in FIG. 7, the ventilation portion 203 has a hole (a penetration hole) 210 formed in the side surface of the bag 201 and a sealing member 220 for sealing the hole 210. The sealing member 220 is made of material having gas permeability and waterproofness. In this embodiment, the sealing member 220 comprises a porous film 221 made of tetrafluoroethylene resin and an unwoven fabric 222 made of nylon stacked on the surface of the porous film 221. The periphery of the reverse surface of the porous film 221 is hermetically secured around the hole 210 in the bag 201 through an adhesive layer 223.

As shown in FIG. 7, the bag 201 has a triple-layer structure formed by laminating PET resin films 206 and 207 on two sides of an aluminum foil 205. Thus, the bag 201 has a light shielding characteristic and waterproofness (moisture resistance). Use of the storing package 200 having the foregoing structure provides the resin layer 80 to always be in contact with flowing air. Thus, deterioration of the resin layer 80 can be prevented so that the life of the stamp making unit 7 is elongated during reservation.

It should be noted that the storing package is not limited to the structure shown in this embodiment. For example, the bag 201 may be made of material having gas permeability and waterproofness. The foregoing material is exemplified by GORE TEX (trade name). The storing package may be formed into a container-like shape.

As described above, the stamp making unit is capable of appropriately protecting the gel-type photosensitive resin for creating the stamping surface. Moreover, the non-cured portions of the photosensitive resin can easily be removed by using the characteristic of the gel after the stamping surface has been formed. Therefore, the photosensitive resin can be protected from being damaged and, thus, it can be easily handled.

The package for the stamp making unit is able to prevent the photosensitive resin from deterioration. Thus, the quality of the stamp making unit can be maintained and the stamp making unit can be stored for a long time. Therefore, the package for the stamp making unit is able to satisfactorily store the stamp making-unit. The package for the stamp making unit is further able to satisfactorily store the stamp making unit at a reduced manufacturing cost.

Although the invention has been described in its preferred form with a certain degree of particularity, it is understood that the present disclosure of the preferred form can be changed in the details of construction and in the combination and arrangement of parts without departing from the spirit and the scope of the invention as hereinafter claimed.

What is claimed is:

1. A stamp making unit including photosensitive resin serving as a base material for forming a stamping surface of a stamp which is transformable from a gel state to a solid state by receiving light, said stamp making unit comprising:

a stock member;

said photosensitive resin bonded to a surface of said stock member on which said stamping surface is formed; and a cover member bonded to a surface of said photosensitive resin and having light transmission properties, wherein adhesion between said photosensitive resin in the gel state and said stock member is weaker than adhesion between said photosensitive resin in the gel state and said cover member, and wherein adhesion between said photosensitive resin in the solid state and said stock member is stronger than adhesion between said photosensitive resin in the solid state and said cover member.

2. The stamp making unit according to claim 1, wherein said stock member further includes a base member through which said photosensitive resin is bonded to said stock member.

3. The stamp making unit according to claim 2, wherein said base member includes a bonding-adhesive layer on a surface facing said photosensitive resin so as to bond said photosensitive resin to said base member, the adhesion of said bonding-adhesive layer being strengthened due to received light.

4. The stamp making unit according to claim 1, wherein said photosensitive resin is ultraviolet-curing type resin.

5. The stamp making unit according to claim 4, wherein said photosensitive resin is ultraviolet-curing silicon resin.

6. A stamp making unit including photosensitive resin serving as a base material for forming a stamping surface of a stamp which is transformable from a gel state to a solid state by receiving light, said stamp making unit comprising:

a stock member;

said photosensitive resin bonded to a surface of said stock member on said stamping surface is formed;

a cover member bonded to a surface of said photosensitive resin and having light transmission properties;

wherein adhesion between said photosensitive resin in the gel state and said stock member is weaker than adhesion between said photosensitive resin in the gel state and said cover member, and wherein adhesion between said photosensitive resin in the solid state and said stock member is stronger than adhesion between said photosensitive resin in the solid state and said cover member; and wherein said cover member includes a bonding-adhesive layer for bonding said cover member to the surface of said photosensitive resin, and the adhesion of said bonding-adhesive layer is weakened due to received light.

7. A stamp making unit comprising:

a stock member;

photosensitive resin transformable from a gel state to a solid state by irradiation, said resin being bonded to said stock member;

a radiation transmissible cover member bonded to said photosensitive resin; and said photosensitive resin being bonded more securely to said cover member than to said stock member in said gel state and being bonded more securely to said stock member than to said cover member in said solid state.

8. A stamp making unit comprising:

a stock member including a base member having a bonding adhesive layer being strength enhanceable by exposure to radiation;

photosensitive resin comprising ultraviolet-curing silicon resin, said resin being transformable from a gel state to a solid state ultraviolet irradiation, said resin being bonded to said stock member;

a cover member having a bonding adhesive layer being strength degradable by exposure to radiation, said cover member being bonded to said resin; and said photosensitive resin being bonded more securely to said cover member than to said stock member in said gel state and being bonded more securely to said stock member than to said cover member in said solid state.

* * * * *